US011245409B2

United States Patent
McPhalen

(10) Patent No.: US 11,245,409 B2
(45) Date of Patent: Feb. 8, 2022

(54) SYSTEMS AND METHODS FOR REMOVING LOW FREQUENCY OFFSET COMPONENTS FROM A DIGITAL DATA STREAM

(71) Applicant: Schneider Electric USA, Inc., Andover, MA (US)

(72) Inventor: Erin C. McPhalen, Victoria (CA)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 17/063,838

(22) Filed: Oct. 6, 2020

(65) Prior Publication Data
US 2021/0111730 A1   Apr. 15, 2021

Related U.S. Application Data

(60) Provisional application No. 62/912,918, filed on Oct. 9, 2019.

(51) Int. Cl.
  *H03M 1/06* (2006.01)
  *H03M 1/08* (2006.01)
  *H03M 1/10* (2006.01)

(52) U.S. Cl.
  CPC .......... *H03M 1/0626* (2013.01); *H03M 1/08* (2013.01); *H03M 1/1023* (2013.01); *H03M 1/1071* (2013.01)

(58) Field of Classification Search
  CPC .... H03M 1/0626; H03M 1/08; H03M 1/1023; H03M 1/1071; H03M 1/12; H03M 1/129; H03H 17/0671
  See application file for complete search history.

(56) References Cited

U.S. PATENT DOCUMENTS 7,750,832 B2 * 7/2010 Noeske .............. H03H 17/0671
  341/143
8,855,180 B2 * 10/2014 Noest .................... H04L 25/061
  375/224

(Continued)

OTHER PUBLICATIONS

Extended European Search Report dated Mar. 1, 2021 for European Patent Application No. 20199685.7, 10 pages.

(Continued)

*Primary Examiner* — Khai M Nguyen
(74) *Attorney, Agent, or Firm* — Locke Lord LLP

(57) ABSTRACT

A method for removing low frequency offset components from a digital data stream includes receiving, at an input of an analog-to-digital converter (ADC), an analog input signal from one or more analog front end components. The analog input signal has an associated low frequency offset due, at least in part, to the analog front end components. The method also includes generating, at an output of the ADC, a digital data stream representative of the analog input signal. The digital data stream having an associated low frequency offset due, at least in part, to the analog front end components and the ADC. One or more low pass finite impulse response (FIR) filters are applied to the digital data stream to detect the low frequency offset components in the digital data stream, and generate a filtered output signal with only the low frequency offset components present. A corrected digital data stream without the low frequency offset components is generated in response thereto, for example, by taking the difference of the filtered output signal from the digital data stream.

20 Claims, 12 Drawing Sheets

(56) References Cited

U.S. PATENT DOCUMENTS

2006/0239388 A1    10/2006  Beamish
2016/0077134 A1*   3/2016  Rezk ...................... G01S 7/021
                                                               324/76.39

OTHER PUBLICATIONS

"Cascaded integrator—comb filter," Wikipedia, Oct. 28, 2018, XP055777607, retrieved from the Internet: URL: https://en.wikipedia.org/w/index.php?title=Cascaded_integrator-comb_filter&oldid=866178494, 4 pages.

* cited by examiner

SYSTEMS AND METHODS FOR REMOVING LOW FREQUENCY OFFSET COMPONENTS FROM A DIGITAL DATA STREAM

CROSS REFERENCE TO RELATED APPLICATION

This application claims the benefit of and priority to U.S. Provisional Application No. 62/912,918, filed on Oct. 9, 2019 under 35 U.S.C. § 119(e), which application is incorporated by reference herein in its entirety.

FIELD

This disclosure relates generally to electrical circuits and, more particularly, to electrical circuits and associated systems and methods for removing low frequency offset components from a digital data stream.

BACKGROUND

As is known, electrical circuits typically include a plurality of electrical components, for example, analog, digital and/or mixed signal electrical components. As is also known, these electrical components (e.g., analog front end components) may introduce noise or offsets into electrical signals received by the electrical components. Additionally, signal sources coupled to the components may also introduce offsets. The introduced offsets (e.g., low frequency offsets) may impact accuracy of the output(s) of the electrical components, and the accuracy of the circuit(s) including the electrical components, if unaccounted for. For example, a measurement circuit is one example type of electrical circuit that typically includes a plurality of electrical components (e.g., measurement elements) for measuring one or more parameters. Offsets introduced by the electrical components and signal sources coupled to the electrical components may impact accuracy of the measurement circuit output, which may lead to energy waste, for example. Accordingly, it is important for the offsets to be accounted for.

SUMMARY

Described herein are systems and methods related to removing offsets, particularly low frequency offset components, from a digital data stream. The digital data stream may be received, for example, from one or more electrical components and/or signal sources in an electrical/power system. The power system may be associated with at least one load, process, building, facility, watercraft, aircraft, or other type of structure, for example.

In one aspect of this disclosure, a method for removing low frequency offset components from a digital data stream includes receiving, at an input of an analog-to-digital converter (ADC), an analog input signal from one or more analog front end components. The analog input signal has an associated low frequency offset due, at least in part, to the analog front end components. The method also includes generating, at an output of the ADC, a digital data stream representative of the analog input signal. The digital data stream has an associated low frequency offset due, at least in part, to the analog front end components and the ADC. The method additionally includes applying one or more low pass finite impulse response (FIR) filters to the digital data stream to detect the low frequency offset components in the digital data stream, and generate a filtered output signal with only the low frequency offset components present. A corrected digital data stream without the low frequency offset components is generated in response thereto, for example, by taking the difference of the filtered output signal from the digital data stream (i.e., the original digital data stream) using a summation circuit (which may take the form of a subtractor or subtraction circuit, for example). In some embodiments, the corrected digital data stream is provided at an output of a circuit. Additionally, in some embodiments the corrected digital data stream is provided to one or more circuits, systems or devices for further processing. For example, the corrected digital data stream may be used in a field programmable gate array (FPGA) where the filtering may be done, a microprocessor, a digital signal processor, and/or a communication port off system processing.

In accordance with some embodiments of this disclosure, the analog front end components may be coupled to one or more signal sources (e.g., a utility power source), with the analog front end components configured to receive one or more signals (e.g., voltage and/or current signals) generated by the one or more signal sources. In some embodiments, the signal sources may contribute to the low frequency offset in the analog signal (e.g., analog input signal) provided by the analog front end components to the ADC. For example, the signal sources may introduce a ground differential to the signal. Additionally, resistive components may contribute to the offset due to wire length, connection corrosion, etc.

The above method, and the other methods (and systems) described below, may include one or more of the following features either individually or in combination with other features in some embodiments. In some embodiments, the low frequency offset components removed from the digital data stream include direct current (DC) offset components, for example, introduced by electrical components (e.g., operational amplifiers), or power supply noise and/or external low frequency influences in the power distribution system as a few examples. In some embodiments, the one or more low pass FIR filters configured to detect the low frequency offset components in the digital data stream, and generate the filtered output signal, include at least one cascaded integrated comb (CIC) decimation filter (such as CIC decimation filter 1400 shown in FIG. 4A). In some embodiments, the one or more low pass FIR filters include at least one recursive moving average filter. In some embodiments, the at least one recursive moving average filter includes at least one CIC decimation filter. As is known, a CIC decimation filter (e.g., 1400, shown in FIG. 4A) is an efficient implementation of a moving average filter. The filter(s) may be implemented in hardware, software, or a combination of hardware and software. CIC decimation filters are well known in the art, and thus will not be described in further detail herein.

In some embodiments, the analog front end components include at least one active electrical component (e.g., op-amps, etc.). Additionally, in some embodiments the analog front end components include at least one passive electrical component (e.g., resistors, capacitors, inductors, etc.).

In some embodiments, the method is implemented in a measurement circuit, for example, using a processor of or associated with the measurement circuit. The measurement circuit may be provided in a high-speed data acquisition device, for example. As used herein, the term "processor" is used to describe an electronic circuit that performs a function, an operation, or a sequence of operations. The function, operation, or sequence of operations can be hard coded into the electronic circuit or soft coded by way of instructions held in a memory device. A processor can perform the function, operation, or sequence of operations using digital values or using analog signals.

In some embodiments, the processor can be embodied, for example, in a specially programmed microprocessor, a digital signal processor (DSP), or an application specific integrated circuit (ASIC), which can be an analog ASIC or a digital ASIC. Additionally, in some embodiments the processor can be embodied in configurable hardware such as FPGAs or programmable logic arrays (PLAs). In some embodiments, the processor can also be embodied in a microprocessor with associated program memory. Furthermore, in some embodiments the processor can be embodied in a discrete electronic circuit, which can be an analog circuit, a digital circuit or a combination of an analog circuit and a digital circuit. It is understood that the terms "processor" and "controller" are sometimes used interchangeably herein. For example, a processor may be used to describe a controller. Additionally, a controller may be used to describe a processor.

In embodiments in which the method is implemented in a measurement circuit, the measurement circuit may include, for example, the analog front end components from which the analog input signal is received, the ADC coupled to receive the analog input signal, and the low pass FIR filters responsive to the digital data stream generated by the ADC. It is understood the measurement circuit may additionally or alternatively include other elements, for example, based on the circuit or device in which the measurement circuit is provided. In one embodiment, the measurement circuit is a measurement circuit for use in a metering device. The metering device may be a metering device (e.g., a high speed transient data acquisition device) for use in a power system, for example.

In some embodiments, the metering device may correspond to an intelligent electronic device (IED). As used herein, an IED is a computational electronic device optimized to perform a particular function or set of functions. Examples of IEDs include smart utility meters, power quality meters, microprocessor relays, digital fault recorders, and other metering devices. IEDs may also be embedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data as electrical parameters representing operating characteristics (e.g., voltage, current, waveform distortion, power, etc.) of the electrical distribution system. These parameters and characteristics may be analyzed by a user to evaluate potential performance, reliability or power quality-related issues. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

It is understood that the disclosed method for removing low frequency components from a digital data stream may additionally or alternatively be implemented in other circuits and devices besides measurement circuits and metering devices. In particular, the concepts and techniques disclosed herein may be found suitable for use in substantially any application where it is desired to remove low frequency components from a digital data stream, as will become further apparent from discussions below. For example, the disclosed concepts and techniques may be found suitable in substantially any instrument measurement application, for example, high voltage applications. In one example implementation, the concepts and techniques are used in a high speed transient capture application in which a circuit responds to an input data stream, where low frequency (e.g., direct current) offsets will lead to erroneous behavior (e.g., incorrect event detection due to waveform distortion). The resulting data stream (i.e., after offset removal) may be recorded, for example, for offline viewing.

In one aspect, the proposed invention uses a series of CIC decimation filters to detect low frequency components from a digital data stream as they are received from the ADC. The combination of the CIC decimation filters (which only pass low frequency signals) and the summation (e.g., subtraction) step removes the low frequency components from the digital data stream. One example benefit is continuous sample by sample removal of the low frequency components requiring no calibration of the device and ensures the sampled digital data only contains the frequencies of interest for the application. This is in contrast to traditional methods of removal, which provide a calibration step during manufacture of the device. As is known, the calibration methods do not account for drift over temperature or aging, for example.

In one aspect, by using a CIC decimation filter as opposed to traditional FIR filter, the proposed implementation of the invention is far more computational efficient and highly suited for implementation on a programmable logic device such as an FPGA. For example, in some embodiments the low frequency component occupies a very small portion of the frequency bandwidth of a signal. Applying a traditional FIR High Pass filter to attenuate this small region would lead to a filter order too high to be reasonably implemented in typical hardware. By cascading low pass filters with decimation after each stage reduces the requirements for the individual stages. As is known, a CIC decimation filter is a low pass filter and highly efficient. In accordance with some embodiments of this disclosure, all but the low frequency components are filtered from the input signal and then subtracted from the original signal, to accomplish the equivalent function of a FIR high pass filter, instead of filtering the input signal directly. The act of decimation and cascading stages allows for even greater efficiencies since the sample rate of each subsequent stage is reduced.

It is understood that there are many other advantages associated with the disclosed systems and methods, as will be appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
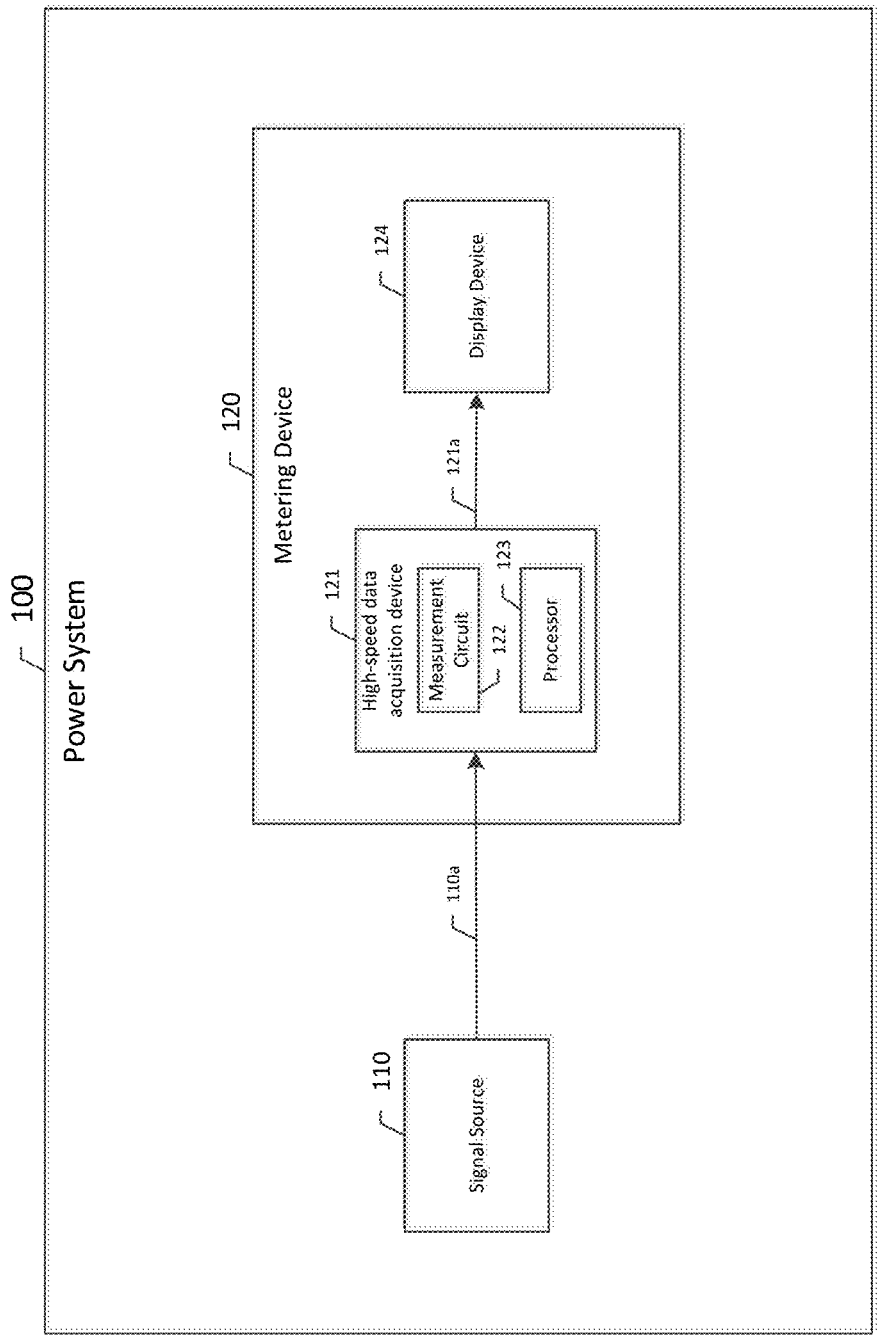
FIG. 1 is a block diagram of an example power system including a signal source and a metering device capable of monitoring one or more parameters of the signal source.

Referring to FIG. 1, an example power system 100 in accordance with embodiments of this disclosure includes a signal source 110 and a metering device 120 capable of monitoring one or more parameters of the signal source 110. The signal source 110 and the metering device 120 may each take a variety of forms. For example, the signal source 110 may take the form of a renewable energy source (e.g., hydropower, geothermal, wind, and solar) or a non-renewable energy source (e.g., fossil fuel power plant). Additionally, the metering device 120 may take the form of a device for monitoring the amount of electric energy consumed by a residence or business, or a particular electrically powered device of the residence or business. The metering device 120 may be coupled to the signal source 110 by one or more connectors and/or mediums (e.g., transmission lines).

In some embodiments, the signal source 110 may be provided as, include, or be coupled to one or more loads in the power system 100. The loads may include, for example, machinery or apparatuses associated with a particular application (e.g., an industrial application), applications, and/or process(es). The machinery may include electrical or electronic equipment, for example. The machinery may also include the controls and/or ancillary equipment associated with the electrical or electronic equipment.

In the example embodiment shown, the metering device 120 includes a high-speed data acquisition device 121 and a display device 124. The high-speed data acquisition device 121 is coupled to receive a signal (or signals) 110a generated by the signal source 110 at an input and configured to generate a signal (or signals) 121a indicative of one or more monitored parameters of the signal(s) 110a at an output thereof. For example, high-speed data acquisition device 121 may be configured to capture, sample or measure an energy-related signal (or signals) (e.g., 110a) generated by the signal source 110 using a measurement circuit 122. Additionally, the high-speed data acquisition device 121 may be configured to generate a signal (or signals) 121a indicative of one or more parameters associated with the energy-related signal(s) at an output thereof. The energy-related signal(s) may include, for example, at least one of current signals and voltage signals. Additionally, the parameters associated with the energy-related signal(s) may include, for example, at least one of voltage, current, power, frequency, power factor, demand, energy and other parameters derived from the current signals and/or voltage signals. Based on the parameter type, the signal(s) 121a may be indicative of one or more values (e.g., instantaneous, average maximum, etc.) of the signal(s) 110a. For example, in embodiments in which the signal(s) 110a (i.e., input signal(s) 110a) is a voltage signal, the signal(s) 121a (i.e., output signal(s) 121a) may be indicative of an instantaneous and/or a maximum average voltage of the signal(s) 110a.

In accordance with some embodiments of this disclosure, the measurement circuit 122 is coupled to a processor 123 of or associated with the high-speed data acquisition device 121, and includes one or more sensor devices, for example, for capturing, sampling or measuring the signal(s) 110a. In accordance with some embodiments of this disclosure, the processor 123 is coupled to receive measurement signals and/or measurement data from the measurement circuit 122, and configured to generate the output signal(s) 121a.

In some embodiments, the output signal(s) 121a may be provided to a display device for displaying the monitored parameters (or select ones of the monitored parameters), or information associated with the monitored parameters (such as power quality issues). The display device (e.g., LCD or LED display) may be the display device 124 of the metering device 120, as shown. Additionally, or alternatively, the display device may be a display device of a remote computing device, for example.

In some embodiments, the output signal(s) 121a may also be provided to control circuitry (not shown) for configuring (or controlling or adjusting) one or more of the monitored parameters (or loads in the power system 100), and/or taking one or more actions in response to the output signal(s) 121a. For example, in embodiments in which the output signal(s) 121a is indicative of power quality issues (as determined by an analysis of the output signal(s) 121a), the output signal(s) 121a may be used by the metering device 120 and/or control circuitry to identify event mitigation opportunities or reduce (or ideally eliminate) an impact of a power quality issue/event and install a mitigation device and/or perform mitigative actions. It is understood that other actions (e.g., generation of alarms, such as transient alarms, etc.) may be additionally or alternatively be taken, for example, as further described in co-pending U.S. patent application Ser. No.

16/137,603, entitled "Dynamic Tolerance Curves For Power Monitoring Systems", which is assigned to the same assignee as the present disclosure. The control circuitry may be control circuitry of the metering device 120 and/or control circuitry coupled to the metering device 120.

In accordance with embodiments of this disclosure, the measurement circuit 122 includes a plurality of electrical components, for example, analog, digital and/or mixed signal electrical components. As is known, electrical components may introduce a low frequency offset to electrical signals received by the electrical components. For example, direct current offset, which is one example type of low frequency offset, may occur as a result of two natural laws which the components may follow: 1. Current cannot change instantaneously in an inductance; and 2. Current must lag the applied voltage by the natural power-factor. Electrical components (e.g., operational amplifiers (op-amp) and analog-to-digital converts (ADCs)) may have an input direct current offset associated with them, which may be a source of direct current offset. An ideal op-amp, for example, amplifies the differential input; if this input difference is 0 volts (i.e. both inputs are at the same voltage), the output should be zero. However, due to manufacturing processes, the differential input transistors of real op-amps may not be exactly matched. This causes the output to be zero at a non-zero value of differential input, called the input offset voltage. In addition, in differential signaling, such as in some measurement circuits, a difference in component value will lead to bias voltage applied to the inputs or present in the system such as a ground potential difference. It is understood that low frequency sources coupled to the measurement circuit 122 and/or interconnects (e.g., between various components associated with the measurement circuit 122) may also introduce an offset.

The introduced offset may impact accuracy of the measurement circuit and the metering device if unaccounted for. For example, deviations in accuracy of measurements performed by the measurement circuit due to the introduced offset may impact the accuracy of the measurement circuit output and, thus, the accuracy of the metering device output. The foregoing may result in inaccurate measurement reporting by the metering device, which may lead to energy waste, for example. Accordingly, it is important for the metering device to have a means for compensating for deviations in measurement accuracy due, for example, to low frequency offset components introduced into measurement data.

Example measurement circuits and example systems, devices and methods for reducing removing low frequency offset components from measurement data (e.g., as provided in a digital data stream) are discussed in connection with figures below. It is understood that power system 100 shown in FIG. 1 is but one of many potential configurations of power systems in accordance with embodiments of this disclosure. For example, while the power system 100 is shown as including a single signal source 110 and a single metering device 120 in the illustrated embodiment, it is understood that the power system 100 may include a plurality of signal sources and/or a plurality of metering devices in some embodiments. In embodiments in which the signal source(s) is/are provided as, includes, or is/are coupled to one or more loads in the power system 100, the metering device(s) may be coupled to a respective one or more of the loads. In addition to capturing energy-related signals (and/or other signals), the metering device(s) may be configured to monitor, analyze and/or control one or more parameters (e.g., energy-related parameters) associated with the loads, for example. The loads and/or the metering device(s) may be associated with (e.g., installed or located in) a particular metering point or points in a power system, and the energy-related signals and/or parameters may be associated with the metering point(s) or points which the loads and/or the metering device(s) are associated with. In some embodiments, the metering device(s) may perform the above-discussed control functionality in part or in whole, and/or be coupled to one or more control devices (e.g., in the power system) which are configured to perform at least part of the control functionality. It is understood that other configurations of power systems are possible.

Figure 2:
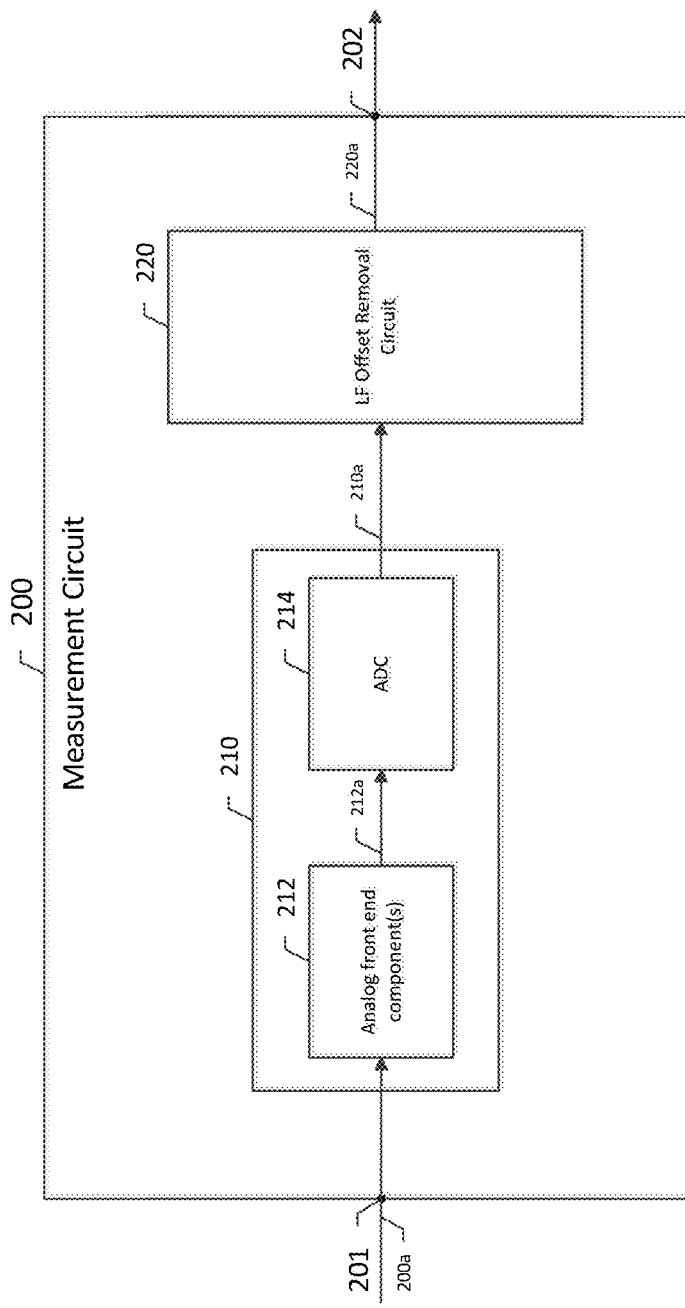
FIG. 2 is a block diagram of an example measurement circuit in accordance with embodiments of the disclosure, the measurement circuit capable of being used in a metering device, for example.

Referring to FIG. 2, an example measurement circuit 200 in accordance with embodiments of this disclosure is shown. The measurement circuit 200 has at least one input (here, an input 201) and at least one output (here, an output 202). Additionally, the measurement circuit 200 includes a signal path 210 (e.g., analog, digital and/or mixed signal path) and a low frequency (LF) offset removal circuit 220. In the illustrated embodiment, the signal path 210 includes one or more analog front end components 212 and an analog-to-digital converter (ADC) 214, with the analog front end components 212 having a first terminal coupled to measurement circuit input 201 and a second terminal coupled to a first terminal of the ADC 220. Additionally, in the illustrated embodiment, the ADC 214 has a second terminal coupled to a first terminal of the LF offset removal circuit 220, and the LF offset removal circuit 220 has a second terminal coupled to measurement circuit output 202. In some embodiments, the measurement circuit input 201 is coupled to an input of a metering device (e.g., 120, shown in FIG. 1) in which the measurement circuit 200 may be used. Additionally, in some embodiments, the measurement circuit output 202 is coupled to an output of the metering device and/or other components (e.g., display device 124, shown in FIG. 1) of the metering device. As discussed above in connection with FIG. 1, the metering device may be coupled to a signal source (e.g., 110, shown in FIG. 1).

In accordance with one embodiment of this disclosure, the analog front end components 212 include at least one component for capturing, sampling or measuring parameters (e.g., voltage, current, etc.) of an input signal (here, input signal 200a). In embodiments, the at least one component may take the form a resistor (e.g., a current sense resistor), a capacitor, and/or substantially any other type of element (or elements) which may be found suitable for measuring the parameters. It is understood that the quantity of the at least one component (e.g., one element, two elements, three elements, etc.) and arrangement(s) of the at least one component (e.g., serial or parallel coupling) may be selected based, at least in part, on the parameter(s) to be measured by the at least one component. For example, in embodiments in which the at least one component is configured to measure a voltage level of the input signal 200a, the at least one component may include a plurality of measurement elements. The plurality of measurement elements may be coupled in a divider configuration, for example. It is understood that the analog front end components may additionally or alternatively include one or more other analog components, for example, capacitors, inductors, diodes, transistors, and operational amplifiers. The analog front end components may take the form of active electrical components and/or passive electrical components.

During operation of measurement circuit 200, the circuit 200 is configured to receive an input signal 200a at input 201 and to provide an output signal 210a indicative of the input signal 201a at output 202. In accordance with some embodiments, the output signal 210a is indicative of a level or value of one or more parameters (e.g., voltage, current, etc.) associated with the input signal 200a. More particularly, in some embodiments the analog front end components 212 are coupled to the input signal 200a and configured to provide an analog signal 212a (i.e., an initial measurement signal) indicative of a respective one or more of the parameters. In some embodiments, the analog signal 212a is related to a value (e.g., a measured resistance value, or charge) of the analog front end components. Additionally, in some embodiments the analog signal 212a is related to an output of the analog front end components 212, or to an output of a node proximate to the analog front end components 212.

The ADC 214 is responsive to the analog signal 212a (e.g., an analog input signal to the ADC) to provide a corresponding converted digital signal 210a at an output of the signal path 210. The digital signal 210a may take the form a digital data stream representative of the analog signal 212a in some embodiments. The digital signal 212a is hereinafter referred to as a digital data stream 210a for simplicity.

The LF offset removal circuit 220, which may be provided as, include or be implemented in a computer processor in some embodiments, is responsive to the digital data stream 210a to generate a corrected digital data stream 220a without low frequency offset components. More particularly, as discussed above in connection with FIG. 1, for example, the measurement circuit (here, measurement circuit 200) may include plurality of electrical components which may introduce a low frequency offset to electrical signals received by the components. In the illustrated embodiment, the analog front end components 212 and the ADC 214, for example, may introduce a low frequency offset to electrical signals received by the analog front end components 212 and the ADC 214. For example, the analog front end components 212 may introduce a low frequency offset to the input signal 200a received by the analog front end components 212. To this effect, the analog signal 212a generated by the analog front end components 212 may have an associated low frequency offset due, at least in part, to the analog front end components 212. Similarly, the ADC 214 may introduce a low frequency offset to the analog signal 212a received by the ADC 214. To this effect, the digital data stream 210a generated by the ADC 210 may have an associated low frequency offset due, at least in part, to the analog front end components 212 and the ADC 214. In other words, the low frequency offset may be compounded across the signal path 210 (here, a signal path including the analog front end components 212 and the ADC 214). It is understood that many ADC configurations (and other means for converting analog signals to digital signals) are possible. For example, the other means of conversion make take the form of, or include, a slope comparator. It is also understood that the signal path 210 may include additional (or alternative) electrical components is some embodiments. For example, the signal path 210 may include operational amplifiers, transistor based amplification circuits, demodulation circuits, etc.

The LF offset removal circuit 220 is configured to generate a corrected digital data stream 220a without the low frequency offset components in real or substantially real time (i.e., without impacting operation of the measurement circuit 200) by detecting the low frequency offset components in the digital data stream 210a received by the LF offset removal circuit 220, and removing the low frequency offset components. For example, in one example implementation of the LF offset removal circuit 220, the LF offset removal circuit 220 is configured to apply one or more low pass finite impulse response (FIR) filters to the digital data stream to detect the low frequency offset components in the digital data stream, and generate a filtered output signal with only the low frequency offset components present. Additionally, in the example implementation the LF offset removal circuit 220 is configured to take the difference of the filtered output signal from the digital data stream to generate a corrected digital data stream 220a without the low frequency offset components. Additional aspects and examples of low frequency offset removal circuits in accordance with embodiments of this disclosure are discussed further in connection with figures below.

In the illustrated embodiment, the corrected digital data stream 220a (e.g., a corrected measurement signal) corresponds to an output signal of the measurement circuit 200. However, it is understood that in some embodiments the corrected digital data stream 220a may be received by additional circuitry (not shown) of the measurement circuit 200, and the output signal of the measurement circuit 200 may be associated with output signals generated or otherwise provided by the additional circuitry. Additionally, it is understood that in some embodiments the corrected digital data stream 220a (or a signal associated with the corrected measurement signal) may correspond to but one of many output signals of the measurement circuit 200. One output signal is shown in FIG. 2 for reasons of simplicity and clarity and is not intended to be limiting.

In some embodiments, an indication of detected offsets may be provided to circuits or systems internal to or external to the measurement circuit 200. For example, the detected offsets may be indicated in the form of a light emitting diode or other visual indicator of the measurement circuit 200 or as a signal provided at a dedicated output pin of the measurement circuit 200. Additionally, an indication of the detected offsets may be provided to a display device of a metering device (e.g., 120, shown in FIG. 1) in which the measurement circuit 200 is used. A user viewing the display device can, for example, respond to the detected offsets which are out of the ordinary (e.g., due to component failure) by replacing one or more of the components (e.g., analog front end components 212) associated with the detected offsets.

The detected offsets may also be stored in a memory device (e.g., a memory device of or associated with the LF offset removal circuit 220) for later analysis in some embodiments. For example, the detected offsets may be analyzed for determining or validating component lifetime, and/or for tracking offsets introduced to signals by electrical components in the measurement circuit 200. The determined component lifetime and/or tracked offsets may be reported through a display device or output signal (of the measurement circuit 200 or externally), for example. In embodiments, the output signal (which may be provided at an output of the measurement circuit 200) may be received by control circuitry (or other circuitry) associated with the measurement circuit 200, for example, for controlling one or more parameters associated with the signal source from which the input signal 200a is received. The one or more parameters may be associated with a state (e.g., on/off status(es), open/closed status(es), high/low status(es)) of the signal source and/or signals (e.g., signal levels of signals) generated by the signal source or other associated devices, as an example. The one or more parameters may also be associated with at least one of temperature, pressure, volume, spatial, rate, humidity, and any other representative physically representative signal, as another example.

While the measurement circuit 200 may be provided in the illustrated form of a circuit with an analog front end portion and a digital portion, it will be appreciated that the particular delineation of which circuit functions are implemented in an analog fashion or with digital circuitry and signals can be varied. For example, one or more portions of the signal path 210 (e.g., analog front end components 212, ADC 214) may take a form that is different from that which is shown. The analog front end components 212, for example, may take the form of digital and/or mixed-signal components in some embodiments. Additionally, the ADC 214 may take the form of a digital-to-analog converter (DAC) in some embodiments. The same principles for removing low frequency offset components from signals still apply.

It will also be appreciated that one or more portions of the measurement circuit 200 may be provided as part of, or be implemented by, a controller (not shown) (e.g., a synchronous digital controller or an analog controller). The controller can, for example, perform the function, operation, or sequence of operations of one or more portions of the signal path 210. The controller can include offset removal circuitry (e.g., as provided by LF offset removal circuit 220) and/or software.

It will further be appreciated that in addition to removing low frequency components from signals, measurement circuit 200 (and the other measurement circuits described throughout this disclosure) may provide correction for drift over temperature or aging, for example. As is known, electrical components (e.g., measurement elements) may drift from their initial or baseline values over time due to external factors such as aging and stress conditions (e.g., humidity, chemical interactions and temperature). For measurement elements, for example, this drift may result in inaccurate in measurements performed by the measurement elements, and the circuits and devices which the measurement elements are associated with. In accordance with various aspects of this disclosure, the measurement circuits disclosed herein provide correction for component drift by continuously evaluating signals from the components for offsets, and removing detected offsets. Example types of drift that could be corrected for are DC drift due to changes in component value (e.g., measurement element resistance value) or a change in DC Offset associated with an active component such as an op amp. In one example implementation, one input is taken to be a reference signal. Op amp circuits are configured in such a way that the reference channel is subtracted from each of the inputs. A change in value will cause the DC component to not be completely removed from the each of the inputs. Additional aspects of drift correction are described in co-pending U.S. patent application Ser. No. 16/026,836, entitled "Measurement Circuit", and in co-pending U.S. patent application Ser. No. 16/127,703, entitled "Measurement Circuit", which applications are assigned to the same assignee as the present disclosure, and are incorporated by reference in their entirety herein.

Figure 3:
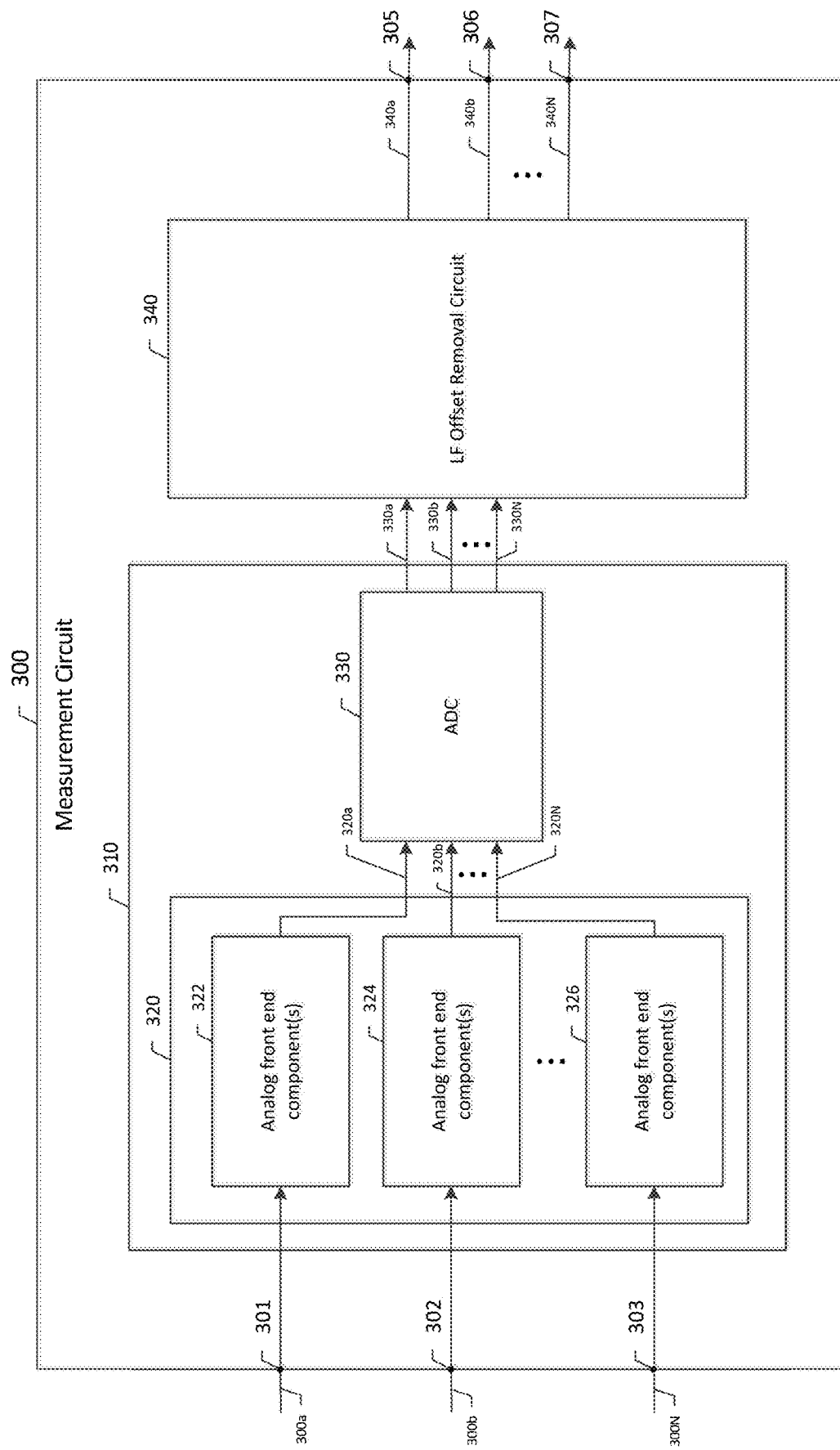
FIG. 3 is a block diagram of another example measurement circuit in accordance with embodiments of the disclosure.

Referring to FIG. 3, another example measurement circuit 300 according to embodiments of the disclosure includes a signal path 310 and a LF offset removal circuit 340. In the illustrated embodiment, the signal path 310 includes at least one analog front end component 320 and an ADC 330.

The at least one analog front end component 320, which may be the same as or similar to analog front end components 212 described above in connection with FIG. 2, includes a plurality of analog front end components (here, analog front end components 322, 324, 326) in the illustrated embodiment. Each of the analog front end components 322, 324, 326 has a terminal (e.g., a first terminal) coupled to a respective input of the measurement circuit 300 (here, inputs 301, 302, 303) in the example embodiment shown. In some embodiments, at least one of the analog front end components 322, 324, 326 includes a plurality of analog front end components.

The ADC 330 has at least one input (here, a like plurality of inputs as the plurality of analog front end components 322, 324, 326) and at least one output (here, a like plurality of outputs as the plurality of inputs). The ADC inputs are coupled to respective terminals (e.g., second terminals) of the analog front end components 322, 324, 326 and the ADC outputs are coupled to at least one input (here, a like plurality of inputs as the ADC outputs) of the LF offset removal circuit 340.

The LF offset removal circuit 340 of measurement circuit 300, which may be the same as or similar to LF offset removal circuit 220 described above in connection with FIG. 2, has at least one output (here, a like plurality of outputs as the plurality of inputs).

During operation of measurement circuit 300, the analog front end components 322, 324, 326 are coupled to input signals 300a, 300b, 300N (e.g., voltage and/or current signals) received at respective inputs 301, 302, 303 of the measurement circuit 300 and configured to provide respective analog signals 320a, 320b, 320N (e.g., initial measurement signals) indicative of the input signals 300a, 300b, 300N. The ADC 330 is responsive to the analog signals 320a, 320b, 320N to provide corresponding converted digital signals (here, digital data streams 330a, 330b, 330N. Similar to digital data stream 210a discussed above in connection with FIG. 2, digital data streams 330a, 330b, 330N have LF offset components present, for example, due at least in part to the analog front end components 322, 324, 326 and the ADC 330.

The LF offset removal circuit 340 is responsive to the digital data streams 330a, 330b, 330N to provide corrected digital data streams 340a, 340b, 340N without LF offset components. The corrected digital data streams 340a, 340b, 340N are each provided to respective measurement circuit outputs 305, 306, 307.

Similar to measurement circuit 200 described above in connection with FIG. 2, measurement circuit 300 is capable of dynamically correcting (i.e., in real or substantially real time) digital data streams 330a, 330b, 330N without impeding normal operation of the measurement circuit 300. More particularly, similar to measurement circuit 200, measurement circuit 300 is capable of detecting and removing low frequency offset components from the digital data streams 330a, 330b, 330N to provide corrected digital data streams 340a, 340b, 340N without low frequency offset components, without impeding normal operation of the measurement circuit 300. An example low frequency offset removal circuit, and example methods for removing the low frequency offset components, are described below in connection with FIG. 4, for example.

Also similar to measurement circuit 200, the corrected digital data streams 340a, 340b, 340N output by the measurement circuit 300 may be received by additional circuitry (not shown) of the measurement circuit 300, and/or be received by circuitry and devices external to the measurement circuit 300, for further processing.

Figure 4:
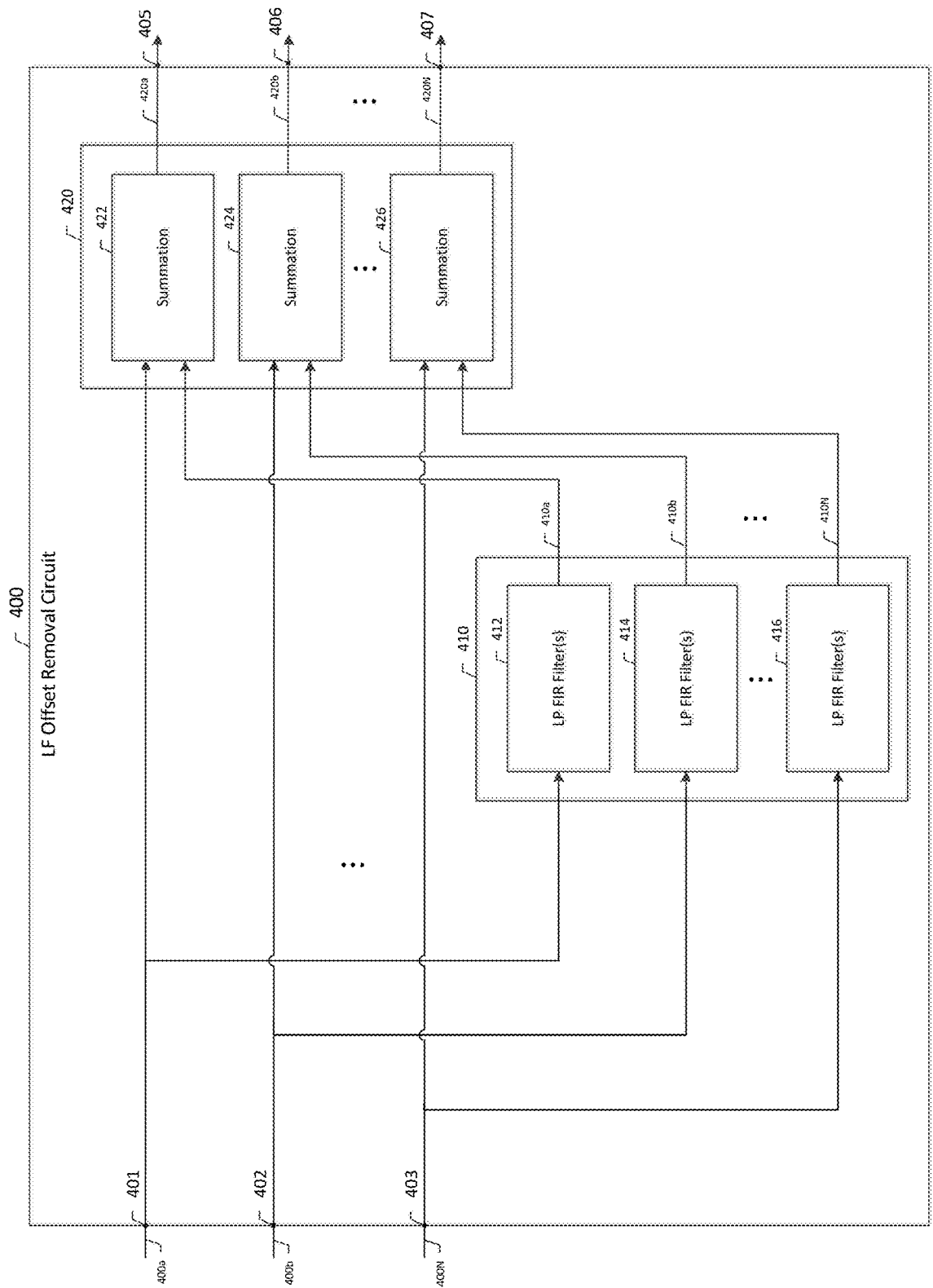
FIG. 4 is a block diagram of a low frequency (LF) offset removal circuit in accordance with embodiments of the disclosure, the LF offset removal circuit capable of being used in a measurement circuit, for example.
Figure 4A:
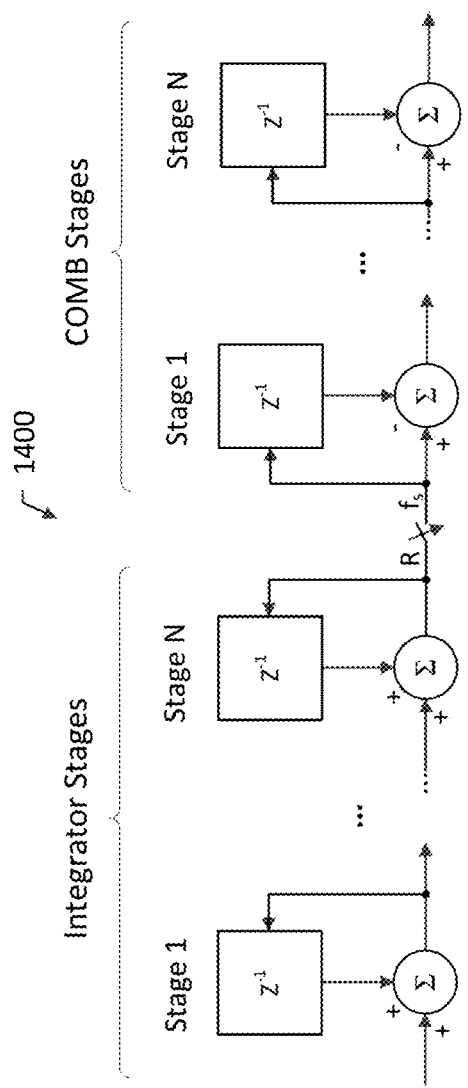
FIG. 4A shows an example arrangement of a cascaded integrated comb (CIC) decimation filter that may be suitable for use in the LF offset removal circuit of FIG. 4, for example.

Referring to FIG. 4, an example low frequency offset removal circuit 400 in accordance with embodiments of this disclosure is shown. In the illustrated embodiment, the low frequency offset removal circuit 400 includes at least one low pass (LP) finite impulse response (FIR) filter 410 and at least one summation circuit 420.

Figure 5:
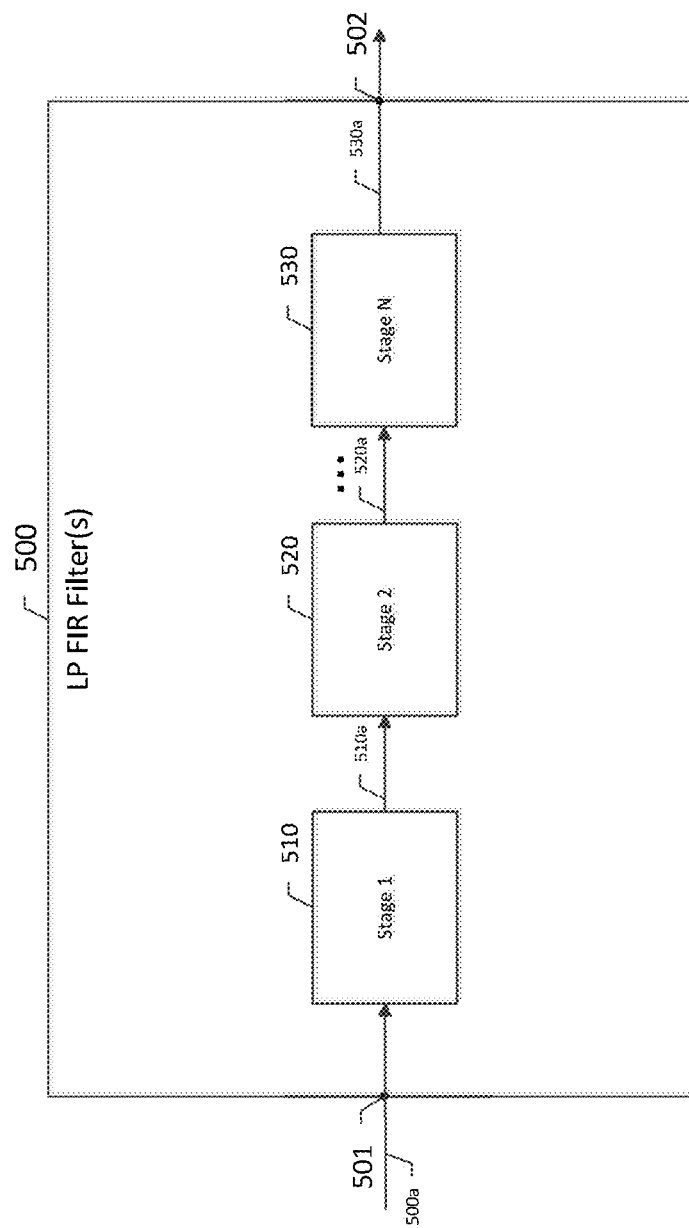
FIG. 5 shows an example arrangement of a low pass finite impulse response filter(s) that may be suitable for use in the LF offset removal circuit of FIG. 4, for example.

The at least one LP FIR filter 410 includes a plurality of LP FIR filters (here, LP FIR filters 412, 414, 416) in the illustrated embodiment. Each of the LP FIR filters 412, 414, 416 has a terminal (e.g., a first terminal) coupled to a respective input of the low frequency offset removal circuit 400 (here, inputs 401, 402, 403) in the example embodiment shown. In some embodiments, at least one of the LP FIR filters 412, 414, 416 includes a plurality of LP FIR filters, for example, arranged in series (as shown in FIG. 5, as will be discussed further below). The LP FIR filters 412, 414, 416 may take the form of a cascaded integrated comb (CIC) decimation filter in some embodiments. Additionally, the LP FIR filters 412, 414, 416 may take the form of a recursive moving average filter (which may include at least one CIC decimation filter) in some embodiments. In accordance with some embodiments, the CIC filter can only have low pass characteristics. By implementing the CIC filter as a multi-rate decimation filter, for example, the filter has no multiplication and therefore is much more efficient. The goal of this example implementation is to effectively create a high pass filter with a pass band at a very low frequency. The act of low pass filtering the signal and then subtracting it from the original waveform, as will be described further below, allows for a very efficient CIC filter (low pass only) to effectively be a high pass filter.

The at least one summation circuit 420 of low frequency offset removal circuit 400 includes a plurality of summation circuits (here, summation circuits 422, 424, 426) configured to subtract the result from the LP FIR filters 412, 414, 416 from the original data stream in the illustrated embodiment. Each of the summation circuits 422 has at least two inputs (here, two inputs for each signal received at the low frequency offset removal circuit inputs 401, 402, 403) and at least one output (here, an output for each signal received at the low frequency offset removal circuit inputs 401, 402, 403). In the illustrated embodiment, the summation circuit outputs are coupled to outputs 405, 406, 407 of the low frequency offset removal circuit 400.

During operation of low frequency offset removal circuit 400, the LP FIR filters 412, 414, 416 are coupled to input signals 400a, 400b, 400N received at respective inputs 401, 402, 403 of the low frequency offset removal circuit 400 and configured to process the input signals 400a, 400b, 400N to detect the low frequency offset components in the input signals 400a, 400b, 400N. In accordance with embodiment of the disclosure, the input signals 400a, 400b, 400N correspond to digital data streams with low frequency offset components present, for example, due to analog front end components, ADC(s) and/or signal sources, similar to digital data streams 330a, 330b, 330N shown in FIG. 3.

The LP FIR filters 412, 414, 416 are also configured to generate respective filtered output signals 410a, 410b, 410N with only the low frequency offset components present.

In accordance with embodiments of this disclosure, the detection of the low frequency offset components is a consequence of the filter topology chosen. For example, a low pass filter topology will be characterized by a pass band and a stop band and associated attenuations. By specifying a pass band that is the same frequency as the low frequency (e.g., direct current) components we wish to remove from the input signals 400a, 400b, 400N, then when the signals are fed into the filters 412, 414, 416, the output of the filters (here, output signals 410a, 410b, 410N) will consist predominately only of the pass band frequency components. In our case, this is the low frequency (e.g., direct current) components we wish to remove from the signal path.

The summation circuits 422, 424, 426 are each responsive to a respective one of the filtered output signals 410a, 410b, 410N and to a respective one of the digital data streams 400a, 400b, 400N to generate corrected digital data streams 420a, 420b, 420c without the low frequency offset components. More particularly, the summation circuits 422, 424, 426 (which may take the form of a subtractor or subtraction circuit, for example) are each responsive to a respective one of the filtered output signals 410a, 410b, 410N and to a respective one of the digital data streams 400a, 400b, 400N to generate corrected digital data streams 420a, 420b, 420c as a combination of the filtered output signals 410a, 410b, 410N and the digital data streams 400a, 400b, 400N. For example, the summation circuits 422, 424, 426 may take the difference of the filtered output signals 410a, 410b, 410N from the digital data streams 400a, 400b, 400N to generate the corrected digital data streams 420a, 420b, 420c without the low frequency offset components. As another example, the results (i.e., outputs) of the LP FIR filters 412, 414, 416 (e.g., FIR lowpass filter) that are decimated could be used for post processing the data. So instead of directly applying the correction, the low frequency offset correction circuit 400 could determine an alternate correction based on many data sets, or determine fault(s) in the system due to a large calculated offset component.

In the illustrated embodiment, the corrected digital data streams 420a, 420b, 420c are received at respective outputs 404, 405, 406 of the low frequency offset removal circuit 400. In some embodiments, the corrected digital data streams 420a, 420b, 420c may be received by additional circuitry (e.g., of a measurement circuit) and devices for further processing.

Referring to FIG. 5, an example arrangement of a LP FIR filter in accordance with embodiment of this disclosure is shown. In accordance with some embodiments, the LP FIR filter 500 may be the same as or similar to the LP FIR filters shown in FIG. 4, for example. As illustrated, the LP FIR filter 500 has at least one input (here, an input 501) and at least one output (here, an output 502). Additionally, the LP FIR filter 500 includes a plurality of stages (here, three stages 510, 520, 530). In accordance with embodiments of the disclosure, the number of stages is based on a number of factors. For example, the number of stages may be selected to be computational efficient, limiting the bit growth and the number of steps required to complete the calculation. The order may be selected, for example, based on the desired attenuation in the pass band (e.g., in our case it may be required to be less than 0.5 bits at the first stage). This is meant to be the overall attenuation of all of the cascaded filter elements. Less than 0.5 bits means that any measurable low frequency component (e.g., DC component) is below the system resolution. In addition, we can create a higher precision result from the FIR filter(s). For example, the input word size could be 12 bits, and the result from the FIR filters can be taken to be 14 bits to improve resolution. The higher the order and the greater the decimation ratio, the larger the results become and are no longer able to be efficiently stored. As is known, the filter order sets the number of operations needed to be performed per sample. Another example factor to be considered in selecting the numbers of stages, is the overall target cut off frequency of low frequency (e.g., direct current) offset removal. For example, in embodiments in which a frequency below 1 Hz is targeted, a single stage filter would be far too large to be implemented. Decimation reduces the clock rate without effecting the filtered waveform accuracy, so subsequent stages can operate at a lower frequency and have more cycles per calculation available. The decimation is multiplicative as well, so three stages at a decimation ratio of 64 is effectively implementing a 262,144 decimation ratio. Attempting to implement this decimation ratio in a single stage would be massive computationally (and, thus, inefficient).

In the illustrated embodiment, the filtering stages 510, 520, 530 are arranged in series, with stage 1 (labeled 510) having an input coupled to the LP FIR filter input 501 and an output coupled to an input of stage 2 (labeled 520), stage 2 having an output coupled to an input of stage 3 (labeled 530), and stage 3 having an output coupled to the LP FIR filter output 502.

During operation of LP FIR filter 500, filtering stage 510 (i.e., stage 1) is coupled to receive an unfiltered digital data stream 500a (which may be similar to data stream 400a shown in FIG. 4, for example) and configured to generate a first filtered digital data stream 510a. Additionally, filtering stage 520 (i.e., stage 2) is coupled to receive first filtered digital data stream 510a and configured to generate a second filtered digital data stream 520a. Further, filtering stage 530 (i.e., stage 3) is coupled to receive second filtered digital data stream 520a and configured to generate a third filtered digital data stream 530a.

In accordance with some embodiments of this disclosure, the third filtered digital data stream 530a, which is received at LP FIR filter output 502 in the illustrated embodiment, includes only the low frequency offset components present in the unfiltered digital data stream 500a. In other words, the filter stages 510, 520, 530 remove portions of the unfiltered digital data stream 500a that are not due to low frequency offsets due, for example, to electrical components and/or signal sources in an electrical circuit in which the LP FIR filter 500 is provided (e.g., measurement circuit 300, shown in FIG. 3).

Similar to corrected digital data streams 420a, 420b, 420c discussed above in connection with FIG. 4, the third filtered digital data stream 530a may be received by additional circuitry (e.g., of a measurement circuit) and devices for further processing in some embodiments.

Figure 6:
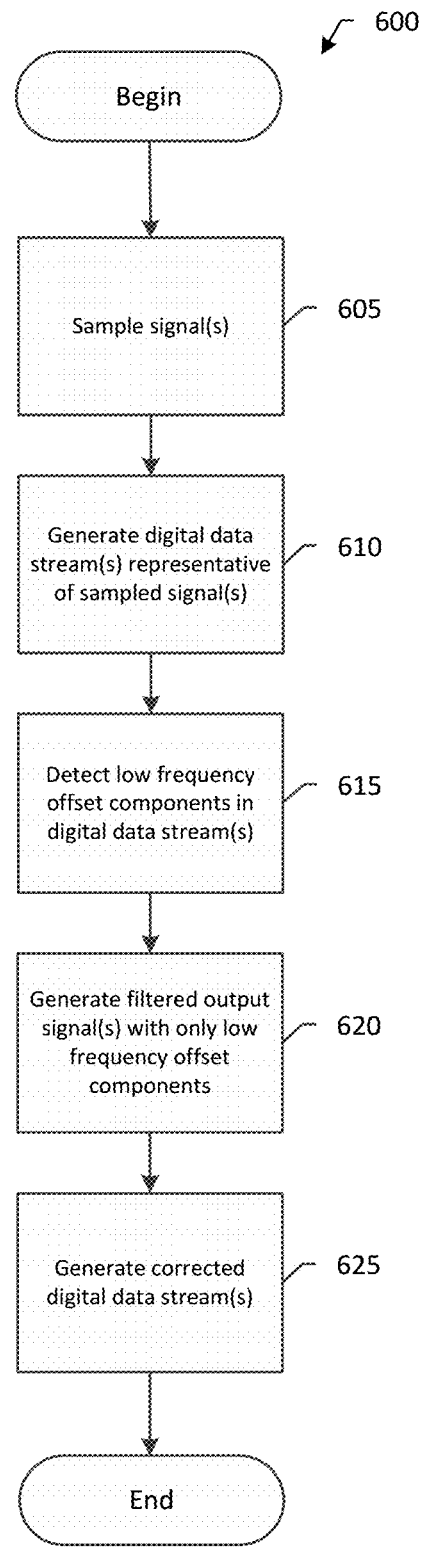
FIG. 6 is a flowchart illustrating an example method for removing low frequency offset components from a digital data stream in accordance with embodiments of the disclosure.

Referring to FIG. 6, a flowchart (or flow diagram) is shown to illustrate an example method (here, method 600) of the disclosure for removing low frequency offset components from a digital data stream. Rectangular elements (typified by element 605 in FIG. 6), as may be referred to herein as "processing blocks," may represent computer software and/or algorithm instructions or groups of instructions. Diamond shaped elements, as may be referred to herein as "decision blocks," represent computer software and/or algorithm instructions, or groups of instructions, which affect the execution of the computer software and/or algorithm instructions represented by the processing blocks. The processing blocks and decision blocks (and other blocks shown) can represent steps performed by functionally equivalent circuits such as a digital signal processor circuit or an application specific integrated circuit (ASIC).

The flowchart does not depict the syntax of any particular programming language. Rather, the flowchart illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowchart described below may be combined in some embodiments. Thus, unless otherwise stated, some features from the flowchart described below may be combined with other features of the flowchart described below, for example, to capture the various advantages and aspects of systems and methods associated with removing low frequency offset components sought to be protected by this disclosure. It is also understood that various features from the flowchart described below may be separated in some embodiments. For example, while the flowchart is shown having many blocks, in some embodiments the illustrated method shown by this flowchart may include fewer blocks or steps.

Referring to FIG. 6, a flowchart illustrates an example method 600 for removing low frequency offset components (e.g., undesirable DC offset components) from a digital data stream. Method 600 may be implemented, for example, on a processor of or associated with a metering device (e.g., 123, shown in FIG. 1) or another device, for example, in a power system. For simplicity of discussions herein, the method 600 will be discussed with reference to a metering device. However, it is understood that method 600 may be implemented on other types of devices. The devices do not necessarily need to be devices in or associated with a power system, but rather may be devices in or associated with a number of other types of systems. For example, method 600 may be implemented in any instrumentation application where unwanted LF or DC signals present in the sampled data stream will impact the goals of the measurement. For instance if a bias was used to activate a particular technology of sensor, the proposed invention would be able to remove the bias from the sample data stream.

As illustrated in FIG. 6, in one example implementation of method 600, the method 600 begins at block 605 where a signal (or signals) is/are captured/sampled by a metering device, for example, using a measurement circuit (e.g., 200, shown in FIG. 2) of the metering device. The signal(s) may include, for example, energy-related signals. The energy-related signals may include, for example, at least one of: a voltage signal, a current signal, and a derived energy-related value. In some embodiments, the derived energy-related value includes at least one of: a calculated, derived, developed, interpolated, extrapolated, evaluated, and otherwise determined additional energy-related value from the at least one of the voltage signal and the current signal. It is understood that many other derived energy-related value(s) and types of energy-related signals (and other input signals) are possible.

In accordance with some embodiments of this disclosure, the signal(s) are captured using one or more components in a signal path (e.g., 210, shown in FIG. 2) of a measurement circuit. As discussed above in connection with FIG. 2, for example, in accordance with some embodiments of this disclosure, the measurement circuit signal path (e.g., analog, digital and/or mixed signal path) may include one or more components capable of capturing or sampling the signal(s). The components may include, for example, one or more analog front end components (e.g., resistor, capacitor, etc.), and the analog front end components may generate or provide one or more signals (i.e., analog signals) indicative of the captured signal(s) at an output (or outputs) thereof. In accordance with some embodiments of this disclosure, the signals indicative of the captured signal(s) include or are indicative of measured parameters (e.g., voltage, current, etc.) associated with the signal(s). As also noted above in connection with FIG. 2, for example, the signal(s) may have an associated low frequency offset (e.g., DC offset). In accordance with some embodiments of this disclosure, the low frequency offset is due, at least in part, to the analog front end components for at least the reasons discussed above in connection with earlier figures.

At block 610, a digital data stream (or digital data streams) representative of the signal(s) captured at block 605 is/are generated, for example, at an output of an ADC (e.g., 220, shown in FIG. 2) and/or other suitable device(s). For example, the signal(s) captured at block 605, or a signal (or signals) indicative of the captured signal(s) (e.g., output signal(s) from analog front end components), may be received at an input of the ADC and the ADC may generate a digital data stream (or digital data streams) representative of the signal(s) at an output (or outputs) thereof.

In accordance with embodiments of this disclosure, the digital data stream(s) have an associated low frequency offset. This offset may be due, at least in part, to the analog components and the ADC and/or the other suitable device(s).

At block 615, low frequency offset components (e.g., low frequency offsets from the analog front end components and ADC) are detected in the digital data stream(s) generated at block 610. For example, the digital data stream(s) may be processed and the low frequency offset components may be detected based on an analysis of the digital data stream(s). In accordance with some embodiments of this disclosure, the analysis is performed and the low frequency offset components are detected by applying one or more low pass FIR filters to the digital data stream, for example, as discussed in connection with figures above. As previously discussed, the low pass FIR filters may include one or more moving average filters (e.g., a recursive moving average filters) in some embodiments. The moving average filters may be implemented as CIC filters, for example. As is known, a CIC filter is an efficient implementation of a moving average filter.

At block 620, a filtered output signal (or filtered output signals) with only the low frequency offset components present are generated. In accordance with some embodiments of this disclosure, the filtered output signal(s) are generated at an output (or outputs) of the low pass FIR filters responsible for detecting the low frequency offset components at block 615.

At block 625, a corrected digital data stream (or corrected digital data streams) without the low frequency offset components is/are generated. In accordance with some embodiments of this disclosure, the corrected digital data stream(s) is/are generated by taking the difference of the filtered output signal(s) generated at block 620 from the digital data stream(s) generated at block 610. For example, the corrected digital data stream(s) may be generated by subtracting the filtered output signal(s) (i.e., removing filtered output signal portions) from the digital data stream(s) using a subtractor circuit or subtractor implemented function. It is understood that there are many example ways in which the corrected digital data stream(s) may be generated, as discussed in connection with figures above.

Subsequent to block 625, the method may end in some embodiments. In other embodiments, the method may return to block 605 and repeat again (e.g., to capture and process additional signal(s)). In some embodiments in which the method ends after block 625, the method may be initiated again in response to user input and/or a control signal, for example.

It is understood that method 600 may include one or more additional or alternative blocks in some embodiments. For example, in some embodiments the method may further include providing the corrected digital data stream(s) generated at block 625 to one or more circuits, systems and/or devices for further processing. For example, in embodiments in which the method 600 is implemented on a metering device and the metering device is provided/used in a power system, the corrected digital data stream(s) may be received by circuits, systems and/or devices in or associated with the metering device in the power system. In one embodiment, the corrected digital data stream may be processed (e.g., on one or more processors in or associated with the metering device), for example, to identify power quality issues (e.g., voltage sags, swells, etc.) in the power system. The processing may occur locally (e.g., at location proximate to the power system) or remotely (e.g., in the cloud).

In some embodiments, the corrected digital data stream(s) and/or signals representative of the corrected digital data stream, may also be provided to a control system. The control system may be responsive to the corrected digital data stream(s) and/or signals representative of the corrected digital data stream(s), for example, to control one or more aspects of a circuit, system (e.g., power system) or device including the metering device. For example, in one embodiment the corrected digital data stream(s) and/or signals representative of the decimated signal may be indicative of a power quality issue in a power system, and the control system may be responsive to the data stream(s) and/or signal(s) to adjust one or more parameters (e.g., associated with equipment/loads) in the power system to reduce the effects of the power quality issue. The control system may also generate alarms and/or couple or decouple systems and devices (e.g., mitigative devices) to reduce the effects of the power quality issue.

Figure 7:
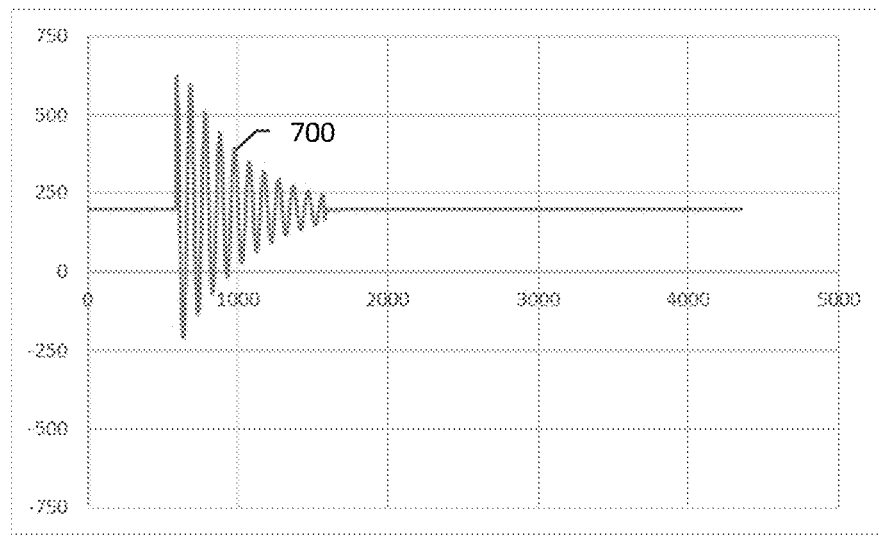
FIG. 7 shows an example sampled signal.
Figure 7A:
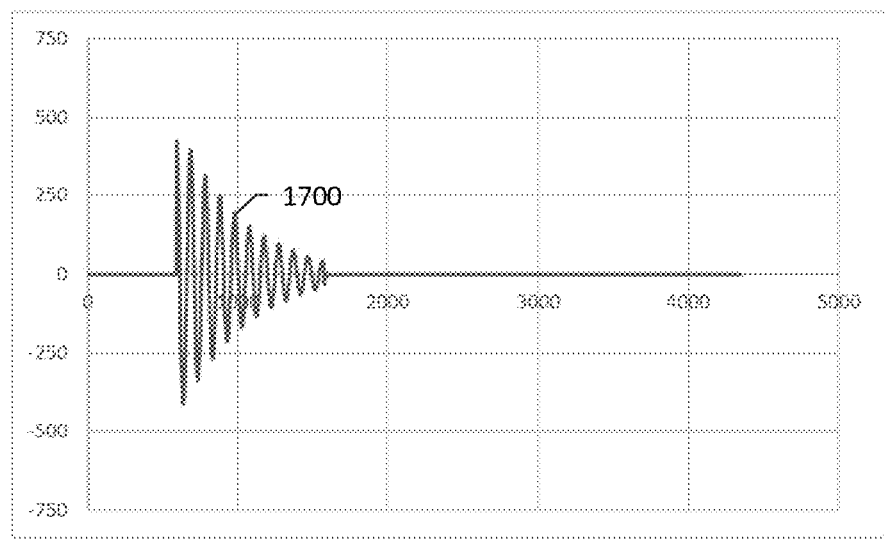
FIG. 7A shows an example signal after LF offset removal.

Referring to FIGS. 7-7A, several example signal waveforms are shown. FIG. 7, for example, shows an example sampled signal 700 (i.e., an original sampled signal) that may be indicative of a signal sampled using the systems and methods disclosed herein (e.g., at block 605 of method 600 shown in FIG. 6). Additionally, FIG. 7A shows an example signal 1700 (e.g., transient signal) after low frequency offset removal using systems and methods in accordance with embodiments of this disclosure (e.g., at block 625 of method 600). In accordance with some embodiments of this disclosure, the signal 1700 is indicative of the signal 700 with low frequency offset components removed from the signal 700. The low frequency offset components may, for example, include DC offset components, as discussed in connection with figures above.

Figure 8:
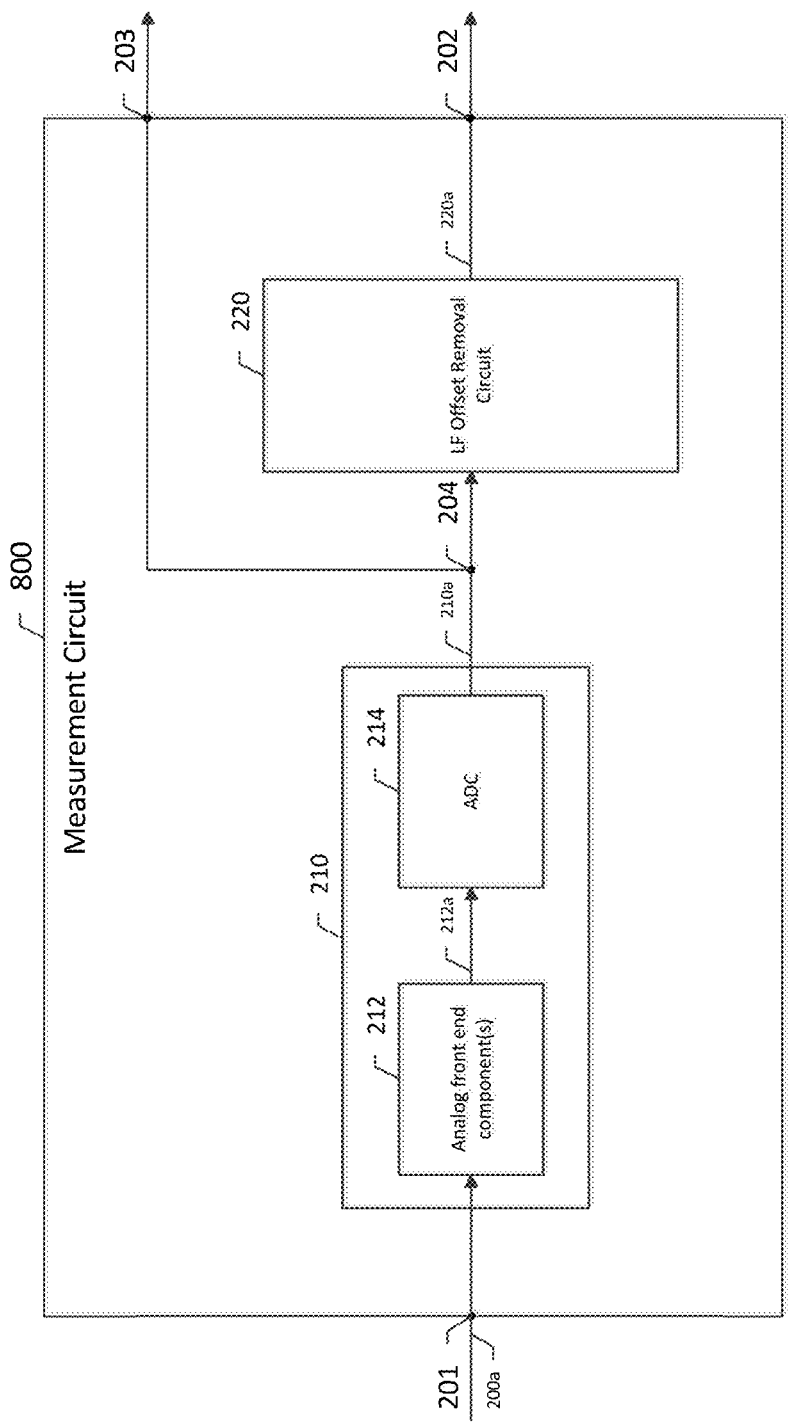
FIG. 8 is a block diagram of an example measurement circuit in accordance with further embodiments of the disclosure.

It is understood that many other supplemental and alternative configurations of the systems and methods discussed above are contemplated. For example, referring to FIGS. 8-8C, several example measurement circuits in accordance with further embodiments of this disclosure are shown. Referring first to FIG. 8, in which like elements of the measurement circuit illustrated in FIG. 2 (i.e., measurement circuit 200) are shown having like reference designations, a measurement circuit 800 in accordance with a further embodiment of this disclosure is shown. As illustrated, the measurement circuit 800 has an input 201 and a plurality of outputs (here, outputs 202, 203). Additionally, the measurement circuit 800 includes a signal path 210 (e.g., analog, digital and/or mixed signal path) and a LF offset removal circuit 220. The measurement circuit 800 further includes a node 204 at which an output (or outputs) of the signal path 210 (e.g., digital signal or data stream 210a) is received. Similar to measurement circuit 200, LF offset removal circuit 220 in measurement circuit 800 is responsive to the output(s) of the signal path 210 to generate a corrected digital data stream/signal 220a which is provided at an output 202. Here, the output(s) of the signal path 210 are also provided at an output 203. The signals at outputs 202, 203 may be provided to circuits or systems internal to or external to the measurement circuit 800 (e.g., processor 123, shown in FIG. 1), for example.

In accordance with some embodiments of this disclosure, the measurement circuit 800 (and, alternative configurations, as described further below) is/are desirable, for example, in instances where a system user wants to analyze a corrected digital data stream/signal 220a (i.e., a signal with low frequency components removed) and a digital data stream/signal 210a with low frequency components present. The corrected digital data stream/signal 220a and the digital data stream/signal 210a may be analyzed, for example, to characterize the input signal 200a received at input 201. For example, the LF component that is present in the input signal 200a may be reported to provide insight into its current level for the corresponding corrected data stream 220a. This could be used in a downstream application to raise an error, for example, if the LF component exceeds a certain threshold. It is to be appreciated that this insight could not be gained by simply looking at the corrected data stream 220a, for example.

Figure 8A:
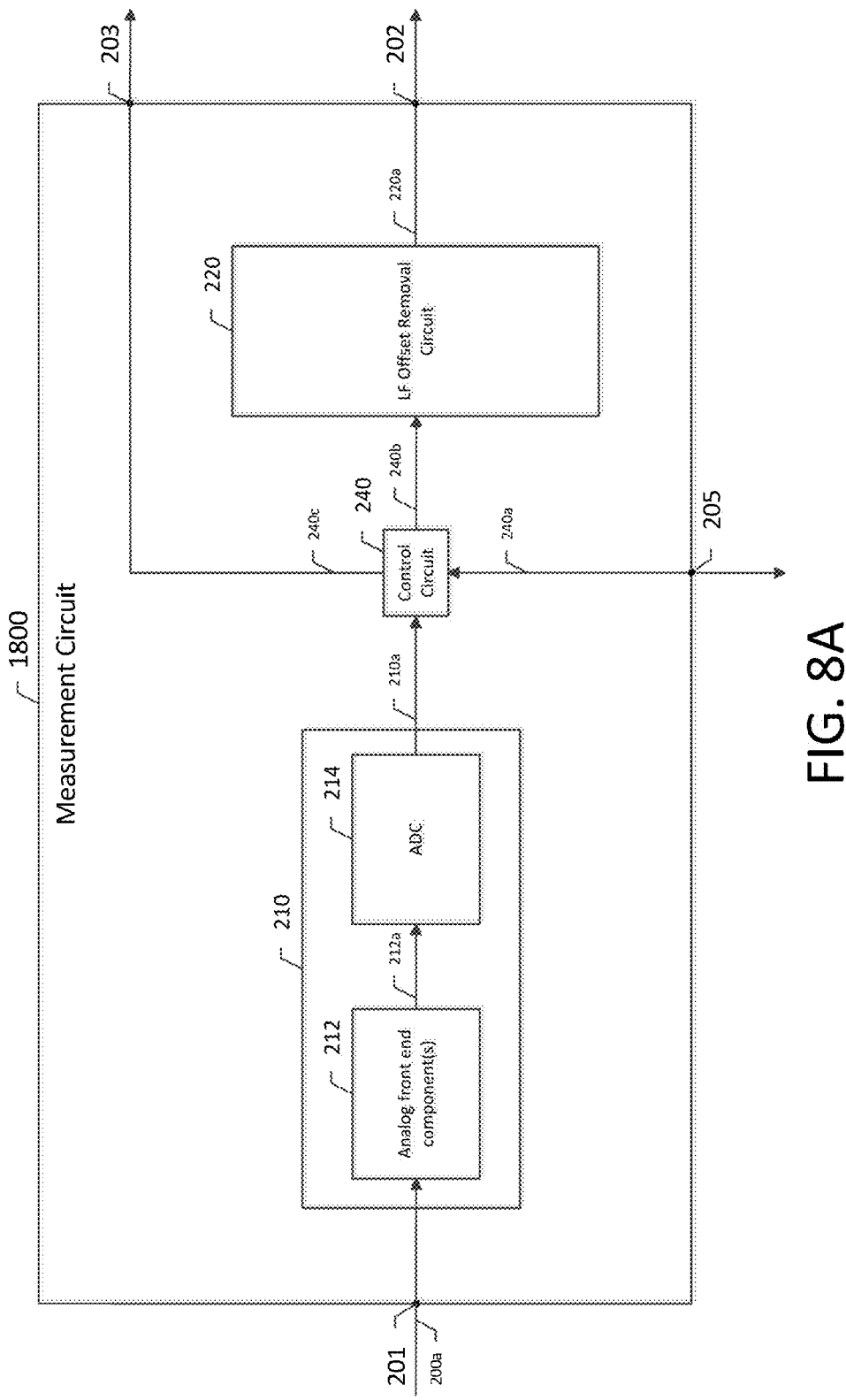
FIG. 8A is a block diagram of another example measurement circuit in accordance with further embodiments of the disclosure.

Referring first to FIG. 8A, another example measurement circuit 1800 in accordance with embodiments of this disclosure is shown. As illustrated, the measurement circuit 1800 additionally includes a control circuit 240. The control circuit 240 is coupled to an output of signal path 210, a terminal (e.g., I/O terminal) 205, an input (or inputs) of LF offset removal circuit 220 and an output 203. In accordance with some embodiments of this disclosure, the control circuit 240 is coupled to receive the output(s) of signal path 210 and configured to control the flow of the signal path output(s) in response to a control signal 240a received at terminal 205. The control signal 240a may be received, for example, from a control system/device and/or a processor (e.g., 123, shown in FIG. 1) coupled to the terminal 205. The control signal 240a may indicate, for example, if the output(s) of signal path 210 should be provided to the LF offset removal circuit 220 (as signal(s) 240b) and to the output 203 (as signal(s) 240c), or just to the LF offset removal circuit 220 (as signal(s) 240b). In some embodiments, signal(s) 240b and signal(s) 240c are the same as or similar to each other. In other embodiments, signal(s) 240b and signal(s) 240c are different from each other.

Figure 8B:
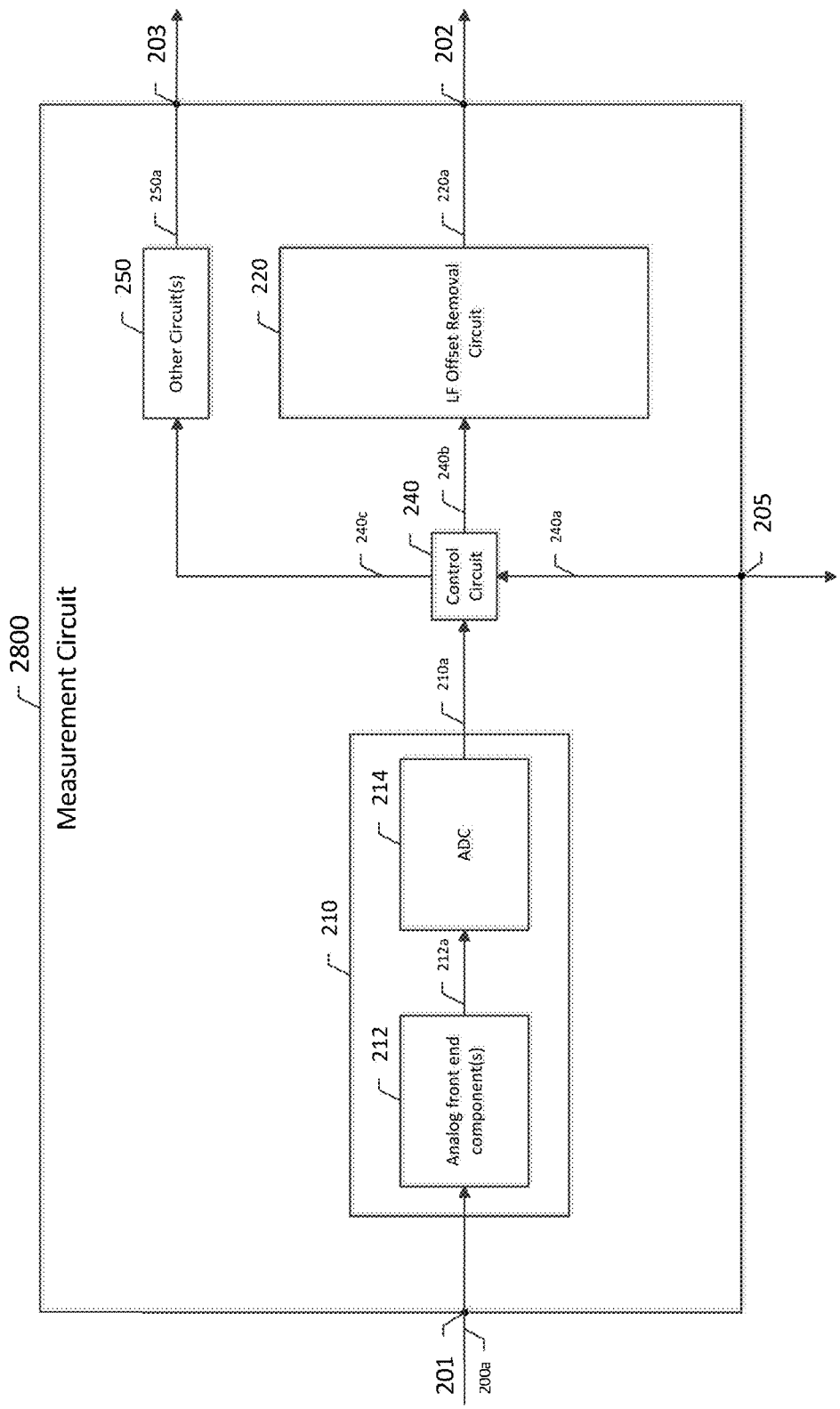
FIG. 8B is a block diagram of another example measurement circuit in accordance with further embodiments of the disclosure.

As illustrated in FIG. 8B, in accordance with some embodiments of this disclosure, the signal(s) 240c may be received by one or more other circuits 250 prior to be being provided to the output 203. More particularly, the other circuits 250 may be coupled to receive the signal(s) 240c at one or more inputs and generate one or more outputs 250a in a measurement circuit 2800. In accordance with some embodiments of this disclosure, the other circuits 250 may include one or more filtering circuits and/or other circuits suitable for capturing information (e.g., parameters) associated with the input signal(s) 200a received at the input 201. For example, the other circuits 250 may include a low pass filter, with the low pass filter being applied before and/or after LF correction is applied using LF offset removal circuit 220. For example, a low pass filter may be used in the case that the ADC sample rate (e.g., of ADC 214) is significantly higher than the area of interest in the application, or a shaping filter may be used to compensate for effects of the measurement circuit (e.g., 2800). It is understood that the other circuits 250 may include other types of filters besides low pass filters and shaping filters. It is also understood that the other circuits 250 may include circuitry besides filters in some embodiments.

Figure 8C:
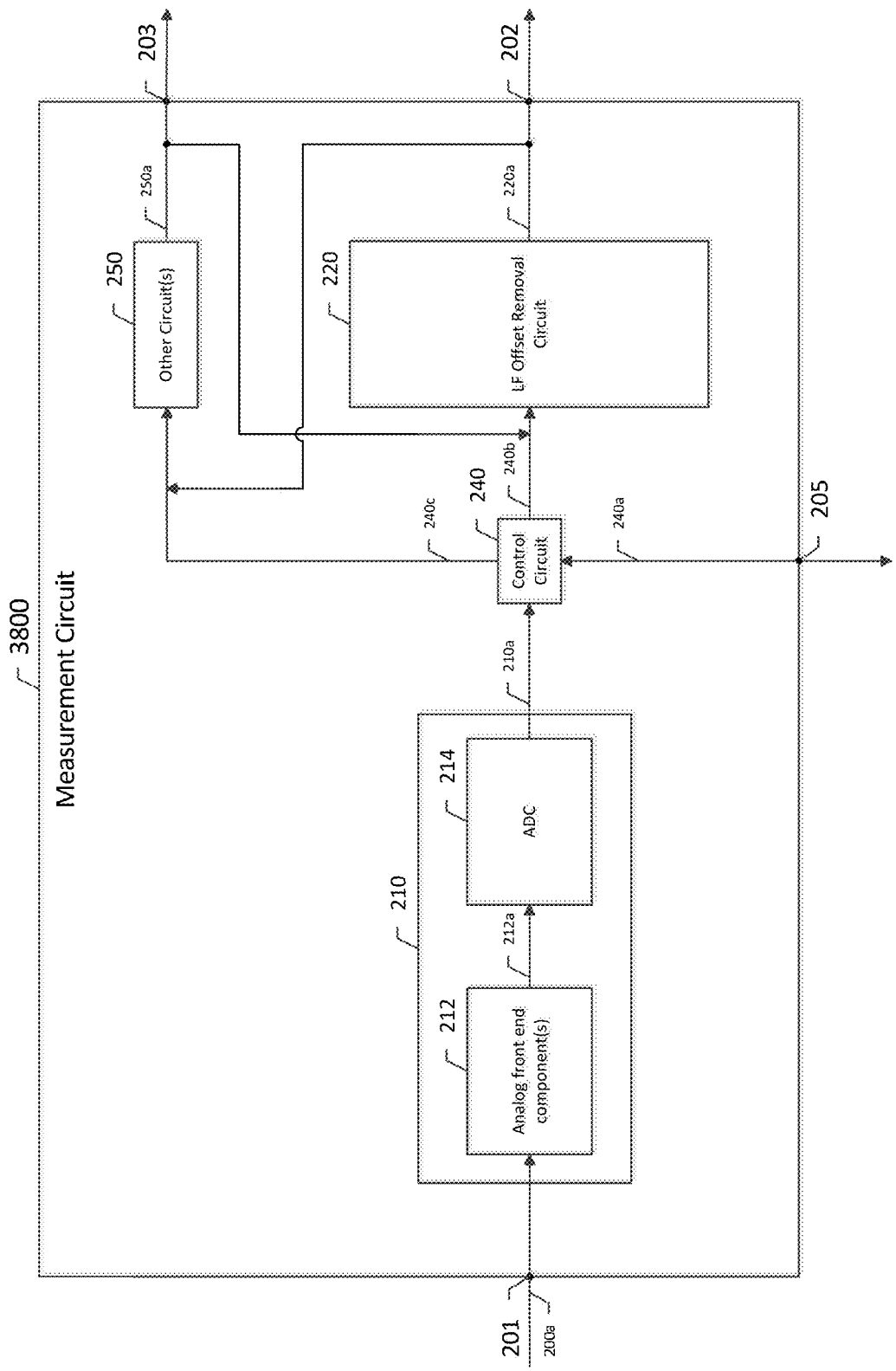
FIG. 8C is a block diagram of another example measurement circuit in accordance with further embodiments of the disclosure.

As illustrated by measurement circuit 3800 in FIG. 8C, and as alluded to above, in accordance with some embodiments of this disclosure, the output(s) 250a of the other circuits 250 may be received at the input(s) of the LF offset removal circuit 220. As also illustrated by measurement circuit 3800, the output(s) 220a of the LF offset removal circuit 220 may also be received at the input(s) of the other circuits 250. In accordance with some embodiments of this disclosure, this implementation allows for additional characterization of the input signal(s) 200a. In some embodiments, the characterization and/or the flow of the signal(s) (e.g., from the output(s) 250a of the other circuits 250 and/or from the output(s) 220a of the LF offset removal circuit 220) is/are controlled or determined in response to the control signal 240a received by the control circuit 240.

It is understood that the above-discussed further example measurement circuits are but a few of many potential supplemental and alternative configurations of the systems and methods disclosed herein.

As illustrated by this disclosure, in one aspect the systems and methods disclosed herein propose using a class of filters called CIC filters for LF and DC removal from a digital data stream. By directing the incoming digital data stream from an ADC through one or more CIC decimation filter stages and then subtracting the resulting filtered waveform from the incoming digital data, a highly economical and efficient method of DC/LF offset removal can be achieved.

It is to be appreciated that the concepts, systems, circuits and techniques sought to be protected herein are not limited to use in the example applications described herein (e.g., metering applications) but rather, may be useful in substantially any application where it is desired to remove low frequency offset components from a digital data stream (e.g., protection relays). For example, as is known, the protection of AC power systems (e.g., through protection relays) relies on an accurate measurement of the power system voltage and current; usually via transducers and signals converted into the digital domain via an accurate sampling system. The majority of protection algorithms rely on the extraction of the power system frequency signals and higher-level harmonic components. The presence of a DC component on the collected sample data can lead to errors within the measurements used for the protection and compromise the accuracy and selectivity of the protection functions. This DC component can be introduced within the relay analogue acquisition circuits for a typical numerical protection relay. The use of the CIC filter(s) to subtract the DC component from the collected samples will reduce a source of error in the data used to protect the power system; this will lead to improved accuracy and performance for the protection function.

While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for removing low frequency offset components from a digital data stream, the method comprising:
    receiving, at an input of an analog-to-digital converter (ADC), an analog input signal from one or more analog front end components, the analog input signal having an associated low frequency offset due, at least in part, to the analog front end components;
    generating, at an output of the ADC, a digital data stream representative of the analog input signal, the digital data stream having an associated low frequency offset due, at least in part, to the analog front end components and the ADC;
    applying one or more low pass finite impulse response (FIR) filters to the digital data stream to detect the low frequency offset components in the digital data stream, and generate a filtered output signal with only the low frequency offset components present;
    controlling, at the output of the ADC, a first path of the digital data stream to the one or more low pass finite impulse response (FIR) filters and a second path of the digital data stream to one or more other circuits configured to capture information associated with the analog input signal; and
    taking the difference of the filtered output signal from the digital data stream to generate a corrected digital data stream without the low frequency offset components.

2. The method of claim 1, wherein the low frequency offset components removed from the digital data stream include direct current (DC) offset components.

3. The method of claim 1, wherein the one or more low pass FIR filters include at least one cascaded integrated comb (CIC) filter.

4. The method of claim 1, wherein the one or more low pass FIR filters include at least one recursive moving average filter.

5. The method of claim 4, wherein the at least one recursive moving average filter includes at least one cascaded integrated comb (CIC) filter.

6. The method of claim 1, wherein the analog front end components include at least one active electrical component.

7. The method of claim 1, wherein the analog front end components include at least one passive electrical component.

8. The method of claim 1, wherein the analog front end components are coupled to a signal source.

9. The method of claim 1, further comprising:
    providing the corrected digital data stream to one or more systems or devices for further processing.

10. The method of claim 1, wherein the method is implemented in a measurement circuit.

11. The method of claim 10, wherein the measurement circuit is a measurement circuit for use in a metering device.

12. The method of claim 11, wherein the metering device is a metering device for use in a power system.

13. A measurement circuit capable of removing low frequency offset components from a digital data stream, the measurement circuit comprising:
    an analog-to-digital converter (ADC) coupled to receive an analog input signal from one or more analog front end components and configured to generate a digital data stream representative of the analog input signal, the analog input signal having an associated low frequency offset due, at least in part, to the analog front end components, and the digital data stream having an associated low frequency offset due, at least in part, to the analog front end components and the ADC;
    a control circuit coupled to an output of the ADC, configured to control a first path of the digital data stream to an input of one or more low pass finite impulse response (FIR) filters and the control circuit further configured to control a second path of the digital data stream to an input of one or more other circuits configured to capture information associated with the analog input signal; and
    a low frequency offset removal circuit including the one or more low pass finite impulse response (FIR) filters and one or more summation circuits, wherein the low pass FIR filters are coupled to receive the digital data stream in the first path from the ADC and configured to process the digital data stream to detect the low frequency offset components in the digital data stream, and generate a filtered output signal with only the low frequency offset components present, and wherein the summation circuit is coupled to receive the filter output signal and the digital data stream and configured to take the difference of the filtered output signal from the digital data stream to generate a corrected digital data stream without the low frequency offset components.

14. The measurement circuit of claim 13, wherein the low frequency offset components removed from the digital data stream include direct current (DC) offset components.

15. The measurement circuit of claim 13, wherein the one or more low pass FIR filters include at least at least one cascaded integrated comb (CIC) filter.

16. The measurement circuit of claim 13, wherein the one or more low pass FIR filters include at least one recursive moving average filter.

17. The measurement circuit of claim 16, wherein the at least one recursive moving average filter includes at least one cascaded integrated comb (CIC) filter.

18. The measurement circuit of claim 13, wherein the measurement circuit is configured to provide the corrected digital data stream to one or more systems or devices for further processing.

19. The measurement circuit of claim 13, wherein the measurement circuit is a measurement circuit for use in a metering device.

20. The measurement circuit of claim 19, wherein the metering device is a metering device for use in a power system.

* * * * *